United States Patent
Ye et al.

(10) Patent No.: US 7,869,473 B2
(45) Date of Patent: Jan. 11, 2011

(54) DIRECTLY MODULATED LASER WITH ISOLATED MODULATED GAIN ELECTRODE FOR IMPROVED FREQUENCY MODULATION

(75) Inventors: Xiong Ye, Newton, MA (US); Hongmin Chen, Waltham, MN (US); Yasuhiro Matsui, Woburn, MA (US); Daniel Mahgerefteh, Palo Alto, CA (US)

(73) Assignee: Finisar Corporation, Sunnyvale, CA (US)

( * ) Notice: Subject to any disclaimer, the term of this patent is extended or adjusted under 35 U.S.C. 154(b) by 120 days.

(21) Appl. No.: 12/053,344

(22) Filed: Mar. 21, 2008

(65) Prior Publication Data

US 2009/0238224 A1    Sep. 24, 2009

(51) Int. Cl.
    *H01S 3/10* (2006.01)
(52) U.S. Cl. ......................................................... 372/28
(58) Field of Classification Search ..................... 372/28
    See application file for complete search history.

(56) References Cited

U.S. PATENT DOCUMENTS

| | | | |
|---|---|---|---|
| 3,324,295 A | 6/1967 | Harris | |
| 3,999,105 A | 12/1976 | Archey et al. | |
| 4,038,600 A | 7/1977 | Thomas et al. | |
| 4,561,119 A | 12/1985 | Epworth | |
| 4,805,235 A | 2/1989 | Henmi | |
| 4,841,519 A | 6/1989 | Nishio | |
| 5,293,545 A | 3/1994 | Huber | |
| 5,325,378 A | 6/1994 | Zorabedian | |
| 5,371,625 A | 12/1994 | Wedding et al. | |
| 5,412,474 A | 5/1995 | Reasenberg et al. | |
| 5,416,629 A | 5/1995 | Huber | |
| 5,465,264 A | 11/1995 | Buhler et al. | |
| 5,477,368 A | 12/1995 | Eskildsen et al. | |
| 5,550,667 A | 8/1996 | Krimmel et al. | |

(Continued)

FOREIGN PATENT DOCUMENTS

GB    2 107 147    4/1983

(Continued)

OTHER PUBLICATIONS

Alexander et al., Passive Equalization of Semiconductor Diode Laser Frequency Modulation, Journal of Lightwave Technology, Jan. 1989, 11-23, vol. 7, No. 1.

(Continued)

*Primary Examiner*—Tod T Van Roy
*Assistant Examiner*—Patrick Stafford
(74) *Attorney, Agent, or Firm*—Workman Nydegger

(57) ABSTRACT

A DBR laser, such as a semiconductor DBR laser is disclosed having improved frequency modulation performance. The laser includes a split gain electrode and a tuning electrode. A modulating current encoding a data signal is injected into a first section of the gain electrode whereas a substantially DC bias voltage is imposed on a second section of the gain electrode positioned between the first gain electrode and the tuning electrode. The first and second gain electrodes are electrically isolated from each other and the tuning electrode by a large isolation resistance. In some embodiments, the isolation resistance is generated by forming the electrodes on a P+ layer and removing portions of the P+ layer between adjacent electrodes. Capacitors may couple to one or both of the second gain electrode and the tuning electrode.

22 Claims, 9 Drawing Sheets

U.S. PATENT DOCUMENTS

| | | | |
|---|---|---|---|
| 5,737,104 A | 4/1998 | Lee et al. | |
| 5,777,773 A | 7/1998 | Epworth et al. | |
| 5,805,235 A | 9/1998 | Bedard | |
| 5,856,980 A | 1/1999 | Doyle et al. | |
| 5,920,416 A | 7/1999 | Beylat et al. | |
| 5,953,139 A | 9/1999 | Nemecek et al. | |
| 5,974,209 A | 10/1999 | Cho et al. | |
| 6,081,361 A * | 6/2000 | Adams et al. | 398/201 |
| 6,096,496 A | 8/2000 | Frankel | |
| 6,104,851 A | 8/2000 | Mahgerefteh | |
| 6,115,403 A | 9/2000 | Brenner et al. | |
| 6,222,861 B1 | 4/2001 | Kuo et al. | |
| 6,271,959 B1 | 8/2001 | Kim et al. | |
| 6,298,186 B1 | 10/2001 | He | |
| 6,331,991 B1 | 12/2001 | Mahgerefteh | |
| 6,359,716 B1 | 3/2002 | Taylor | |
| 6,473,214 B1 | 10/2002 | Roberts et al. | |
| 6,506,342 B1 | 1/2003 | Frankel | |
| 6,563,623 B1 | 5/2003 | Penninckx et al. | |
| 6,577,013 B1 | 6/2003 | Glenn et al. | |
| 6,618,513 B2 | 9/2003 | Evankow, Jr. | |
| 6,654,564 B1 | 11/2003 | Colbourne et al. | |
| 6,665,351 B2 | 12/2003 | Hedberg et al. | |
| 6,748,133 B2 | 6/2004 | Liu et al. | |
| 6,778,307 B2 | 8/2004 | Clark | |
| 6,807,215 B2 * | 10/2004 | Lam et al. | 372/50.11 |
| 6,810,047 B2 | 10/2004 | Oh et al. | |
| 6,815,786 B2 * | 11/2004 | Ogasawara et al. | 257/432 |
| 6,836,487 B1 | 12/2004 | Farmer et al. | |
| 6,847,758 B1 | 1/2005 | Watanabe | |
| 6,947,206 B2 | 9/2005 | Tsadka et al. | |
| 6,963,685 B2 | 11/2005 | Mahgerefteh et al. | |
| 7,013,090 B2 | 3/2006 | Adachi et al. | |
| 7,054,538 B2 | 5/2006 | Mahgerefteh et al. | |
| 7,076,170 B2 | 7/2006 | Choa | |
| 7,123,846 B2 | 10/2006 | Tateyama et al. | |
| 7,263,291 B2 | 8/2007 | Mahgerefteh et al. | |
| 7,280,721 B2 | 10/2007 | McCallion et al. | |
| 2002/0154372 A1 | 10/2002 | Chung et al. | |
| 2002/0159490 A1 | 10/2002 | Karwacki | |
| 2002/0176659 A1 | 11/2002 | Lei et al. | |
| 2003/0002120 A1 | 1/2003 | Choa | |
| 2003/0067952 A1 | 4/2003 | Tsukiji et al. | |
| 2003/0099018 A1 | 5/2003 | Singh et al. | |
| 2003/0147114 A1 | 8/2003 | Kang et al. | |
| 2003/0193974 A1 | 10/2003 | Frankel et al. | |
| 2004/0008933 A1 | 1/2004 | Mahgerefteh et al. | |
| 2004/0008937 A1 * | 1/2004 | Mahgerefteh et al. | 385/37 |
| 2004/0036943 A1 * | 2/2004 | Freund et al. | 359/240 |
| 2004/0076199 A1 | 4/2004 | Wipiejewski et al. | |
| 2004/0096221 A1 | 5/2004 | Mahgerefteh et al. | |
| 2004/0218890 A1 | 11/2004 | Mahgerefteh et al. | |
| 2005/0100345 A1 | 5/2005 | Welch et al. | |
| 2005/0111852 A1 | 5/2005 | Mahgerefteh et al. | |
| 2005/0175356 A1 | 8/2005 | McCallion et al. | |
| 2005/0196177 A1 * | 9/2005 | Moran | 398/182 |
| 2005/0206989 A1 | 11/2005 | Marsh | |
| 2005/0271394 A1 | 12/2005 | Whiteaway et al. | |
| 2005/0286829 A1 | 12/2005 | Mahgerefteh et al. | |
| 2006/0002718 A1 | 1/2006 | Matsui et al. | |
| 2006/0018666 A1 | 1/2006 | Matsui et al. | |
| 2006/0029358 A1 | 2/2006 | Mahgerefteh et al. | |
| 2006/0029396 A1 | 2/2006 | Mahgerefteh et al. | |
| 2006/0029397 A1 | 2/2006 | Mahgerefteh et al. | |
| 2006/0228120 A9 | 10/2006 | McCallion et al. | |
| 2006/0233556 A1 | 10/2006 | Mahgerefteh et al. | |
| 2006/0274993 A1 | 12/2006 | Mahgerefteh et al. | |

FOREIGN PATENT DOCUMENTS

| | | |
|---|---|---|
| WO | 9905804 | 2/1999 |
| WO | 0104999 | 1/2001 |
| WO | 03005512 | 1/2003 |

OTHER PUBLICATIONS

Binder, J. et al., 10 Gbit/s-Dispersion Optimized Transmission at 1.55 um Wavelength on Standard Single Mode Fiber, IEEE Photonics Technology Letters, Apr. 1994, 558-560, vol. 6, No. 4.

Hyryniewicz, J.V., et al., Higher Order Filter Response in Coupled Microring Resonators, IEEE Photonics Technology Letters, Mar. 2000, 320-322, vol. 12, No. 3.

Koch, T. L. et al., Nature of Wavelength Chirping in Directly Modulated Semiconductor Lasers, Electronics Letters, Dec. 6, 1984, 1038-1039, vol. 20, No. 25/26.

Kurtzke, C., et al., Impact of Residual Amplitude Modulation on the Performance of Dispersion-Supported and Dispersion-Mediated Nonlinearity-Enhanced Transmission, Electronics Letters, Jun. 9, 1994, 988, vol. 30, No. 12.

Li, Yuan P., et al., Chapter 8: Silicon Optical Bench Waveguide Technology, Optical Fiber Communications, 1997, 319-370, vol. 111B, Lucent Technologies, New York.

Little, Brent E., Advances in Microring Resonators, Integrated Photonics Research Conference 2003.

Mohrdiek, S. et al., 10-Gb/s Standard Fiber Transmission Using Directly Modulated 1.55-um Quantum-Well DFB Lasers, IEEE Photonics Technology Letters, Nov. 1995, 1357-1359, vol. 7, No. 11.

Morton, P.A. et al., "38.5km error free transmission at 10Gbit/s in standard fibre using a low chirp, spectrally filtered, directly modulated 1.55um DFB laser", Electronics Letters, Feb. 13, 1997, vol. 33(4).

Prokais, John G., Digital Communications, 2001, 202-207, Fourth Edition, McGraw Hill, New York.

Rasmussen, C.J., et al., Optimum Amplitude and Frequency-Modulation in an Optical Communication System Based on Dispersion Supported Transmission, Electronics Letters, Apr. 27, 1995, 746, vol. 31, No. 9.

Shalom, Hamutali et al., On the Various Time Constants of Wavelength Changes of a DFB Laser Under Direct Modulation, IEEE Journal of Quantum Electronics, Oct. 1998, pp. 1816-1822, vol. 34, No. 10.

Wedding, B., Analysis of fibre transfer function and determination of receiver frequency response for dispersion supported transmission, Electronics Letters, Jan. 6, 1994, 58-59, vol. 30, No. 1.

Wedding, B., et al., 10-Gb/s Optical Transmission up to 253 km Via Standard Single-Mode Fiber Using the Method of Dispersion-Supported Transmission, Journal of Lightwave Technology, Oct. 1994, 1720, vol. 12, No. 10.

Yu, et al., Optimization of the Frequency Response of a Semiconductor Optical Amplifier Wavelength Converter Using a Fiber Bragg Grating, Journal of Lightwave Technology, Feb. 1999, 308-315, vol. 17, No. 2.

Corvini, P.J. et al., Computer Simulation of High-Bit-Rate Optical Fiber Transmission Using Single-Frequency Lasers, Journal of Lightwave Technology, Nov. 1987, 1591-1596, vol. LT-5, No. 11.

Lee, Chang-Hee et al., Transmission of Directly Modulated 2.5-Gb/s Signals Over 250-km of Nondispersion-Shifted Fiber by Using a Spectral Filtering Method, IEEE Photonics Technology Letters, Dec. 1996, 1725-1727, vol. 8, No. 12.

Matsui, Yasuhiro et al, Chirp-Managed Directly Modulated Laser (CML), IEEE Photonics Technology Letters, Jan. 15, 2006, pp. 385-387, vol. 18, No. 2.

Nakahara, K. et al, 40-Gb/s Direct Modulation With High Extinction Ratio Operation of 1.3-μm InGaAl As Multiquantum Well Ridge Waveguide Distributed Feedback Lasers, IEEE Photonics Technology Leters, Oct. 1, 2007, pp. 1436-1438, vol. 19 No. 19.

Sato, K. et al, Chirp Characteristics of 40-Gb/s Directly Modulated Distributed-Feedback Laser Diodes, Journal of Lightwave Technology, Nov. 2005, pp. 3790-3797, vol. 23, No. 11.

\* cited by examiner

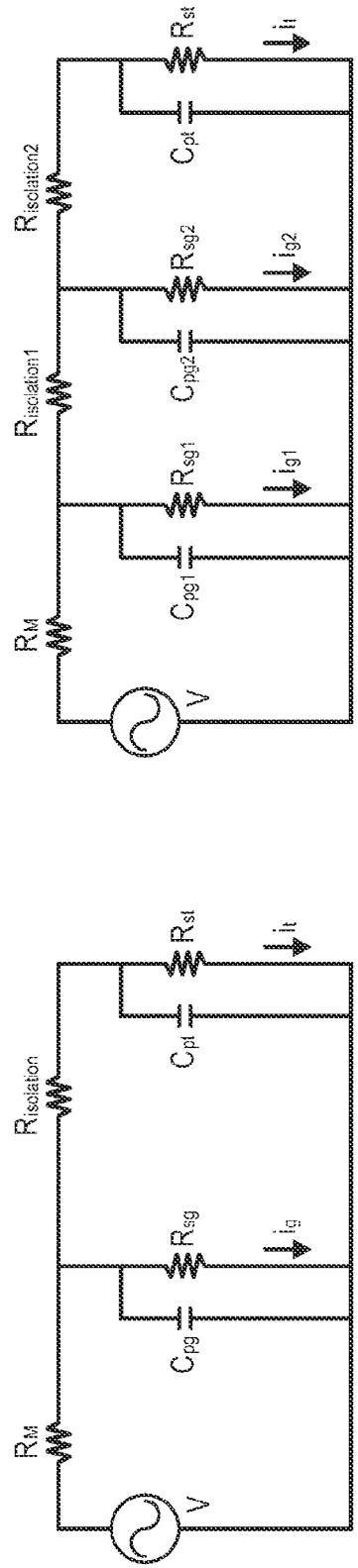
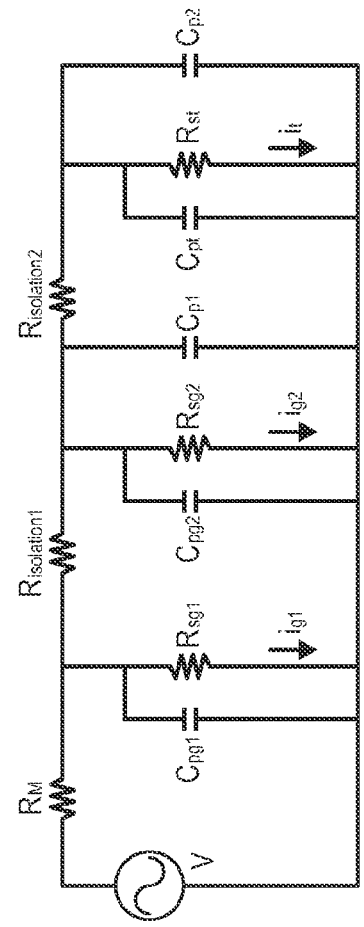
Fig. 8A
Fig. 8B
Fig. 9

DIRECTLY MODULATED LASER WITH ISOLATED MODULATED GAIN ELECTRODE FOR IMPROVED FREQUENCY MODULATION

BACKGROUND OF THE INVENTION

1. The Field of the Invention

This application relates to optical transmitters and, more particularly, to optical transmitters incorporating a directly modulated laser.

2. The Relevant Technology

U.S. patent application Ser. No. 11/272,100, filed Nov. 8, 2005 by Daniel Mahgerefteh et al. for POWER SOURCE FOR A DISPERSION COMPENSATION FIBER OPTIC SYSTEM discloses a laser transmitter demonstrating error free transmission of 10 Gb/s signal at 1550 nm in standard single mode fiber with distance longer than 200 km without dispersion compensation using a directly modulated laser coupled to a passive optical spectrum reshaper. One element in such transmitters, and other frequency shift keying technology, is a laser source with substantially flat frequency modulation response from low frequencies up to the frequency comparable to the bit rate of the transmission systems, e.g., 1 MHz to 10 GHz for a 10 Gb/s digital signal.

Distributed feedback (DFB) lasers may be used to achieve the desired flat frequency modulation. Both fixed wavelength application and small-range wavelength tunable application based on temperature tuning (~0.1 nm/° C.) have been demonstrated. One way to get large range wavelength tunable, and flat frequency modulation is to perform gain modulation of a distributed Bragg reflector (DBR) laser.

Referring to FIG. 1, a DBR laser 10 generally consists of a wavelength tuning section 12 and a gain section 14. The wavelength tuning section 12 may contain a DBR section 16 and a phase section 18. The DBR section 16 may serve as the coarse wavelength tuning section whereas phase section 18 is the fine wavelength tuning section. Both DBR section 16 and phase section 18 are preferably a same-material system with a photo luminescence wavelength (for example, 1.3 μm to 1.45 μm) below the lasing wavelength (for example, 1.55 μm) in order to avoid excessive loss. By injecting current into the DBR section 16 and the phase section 18, the carrier density in these sections will change. Due to the plasma effect, the refractive index of these sections will change, resulting in both peak reflection wavelength change and cavity mode frequency shift in the DBR section 16 and a cavity mode frequency shift in the phase section 18. By individual control of these two sections 16, 18, continuous wavelength tuning with high side mode suppression ratio has been demonstrated. Various configurations of DBR lasers with full C-band tuning capability have been used as tunable continuous wave (CW) sources recently.

To generate high speed frequency modulation, the gain section 14 of the DBR laser 12 is modulated with current modulation using the same principle as the gain modulated DFB laser. When the gain current of the DBR laser 12 is modulated, the photon density in the cavity is modulated. This in turn modulates the carrier density of the gain section 14 due to gain compression. The change of the carrier density results in a change in the refractive index of the gain section 14 and therefore changes the frequency of the laser 12. The frequency modulation of the laser 12 is sometimes referred to as chirp.

The frequency modulation properties of lasers have been studied significantly, and generally includes two parts: the carrier density effect and the thermal effect. (Diode lasers and photonic integrated circuits, Larry A. Coldren, Scott W. Corzine, Wiley interscience, page 211 to 213).

A typical small signal modulation frequency modulation response typically includes the carrier effect, including transient chirp, adiabatic chirp, and thermal effect. The thermal chirp generally has a time constant of ~20 ns. Methods for suppressing thermal chirp have been demonstrated.

The FM small signal response induced by the gain current can be expressed according to the following equations:

$$\frac{\Delta v}{\Delta I_g} = \left(\frac{\Delta v}{\Delta I_g}\right)_{Carrier} + \left(\frac{\Delta v}{\Delta I_g}\right)_{thermal} \quad \text{(Eq. 1)}$$

$$\left(\frac{\Delta v}{\Delta I_g}\right)_{Carrier} = v_{adiabatic}(1 + j\omega/\gamma_{PP})\frac{\omega_R^2}{\omega_R^2 - \omega^2 + j\gamma\omega} \quad \text{(Eq. 2)}$$

$$\left(\frac{\Delta v}{\Delta I_g}\right)_{Thermal} = \frac{-v_{thermal}}{(1 + j\omega\tau_{thermal})} \quad \text{(Eq. 3)}$$

In the above three equations: $v_{adiabatic}$ represents the adiabatic chirp efficiency (typically ~0.2 GHz/mA), $v_{thermal}$ represents the thermal chirp efficiency (typically ~0.2 GHz/mA), $\gamma_{PP}$ is ~30 GHz, $\gamma$ is ~30 GHz, fr: is ~10 GHz, and $\tau_{thermal}$ is ~20 ns. (Diode lasers and photonic integrated circuits, Larry A. Coldren, Scott W. Corzine, Wiley interscience, page 211 to 213).

When the gain section 14 of the DBR laser 12 is modulated, another type of non-flatness of frequency modulation is identified, the frequency modulation small signal response is shown in FIG. 2. As is apparent from FIG. 2, segment 20 of the frequency response curve illustrates diminished response to frequency modulation. The non-flatness of the small signal response in the frequency range of 10 to 100 MHz can also be seen from time domain FM analysis with a "1010" data pattern at data rate of 100 Mb/s as shown in FIG. 3. Segments 22a, 22b of the time domain response illustrate a delayed chirp response on the rising and falling edges of the laser output in response to a square wave signal.

In the small signal response domain, slow chirp may be defined as the non-flatness of the FM small signal response between 10 to 100 MHz. The high frequency (>=10 GHz) non-flatness results from transient chirp and laser intrinsic speed, the low frequency (<10 MHz) non-flatness results from thermal chirp. In the time domain, slow chirp is defined as changes in frequency modulation that do not match the profile of the modulating current.

When modulated with high data rate, e.g. 10 Gb/s, this slow chirp will result in pattern dependence that deteriorates the transmission signal. It therefore would be an advancement in the art to improve the FM efficiency of DBR lasers by reducing slow chirp.

BRIEF SUMMARY OF THE INVENTION

In one aspect of the invention, a laser, such as a semiconductor DBR laser, includes a gain section and a passive section, which may be embodied as a distributed Bragg reflector (DBR). A tuning electrode is positioned over the passive section and first and second gain electrodes are positioned over the gain section. The first gain electrode is coupled to a modulation current source that supplies a signal encoding a data signal. The second gain electrode is positioned between the first gain electrode and the tuning electrode. Both the second gain electrode and tuning electrode are coupled to substantially DC bias voltages.

In another aspect of the invention, the first and second gain electrodes and tuning electrode are electrically isolated from one another by a large isolation resistance. In some embodiments, the isolation resistance is generated by forming the electrodes on a P+ layer and removing portions of the P+ layer between adjacent electrodes.

In another aspect of the invention, capacitors are coupled to one or both of the second gain electrode and tuning electrode.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 8A is a circuit diagram modeling a DBR laser in accordance with the prior art;

FIG. 8B is a circuit diagram modeling a split contact DBR laser in accordance with an embodiment of the present invention;

FIG. 9 is a circuit diagram of a split contact DBR laser having isolation capacitors coupled to a tuning electrode and a gain bias electrode thereof in accordance with an embodiment of the present invention.

DETAILED DESCRIPTION OF THE PREFERRED EMBODIMENTS

Figure 4:
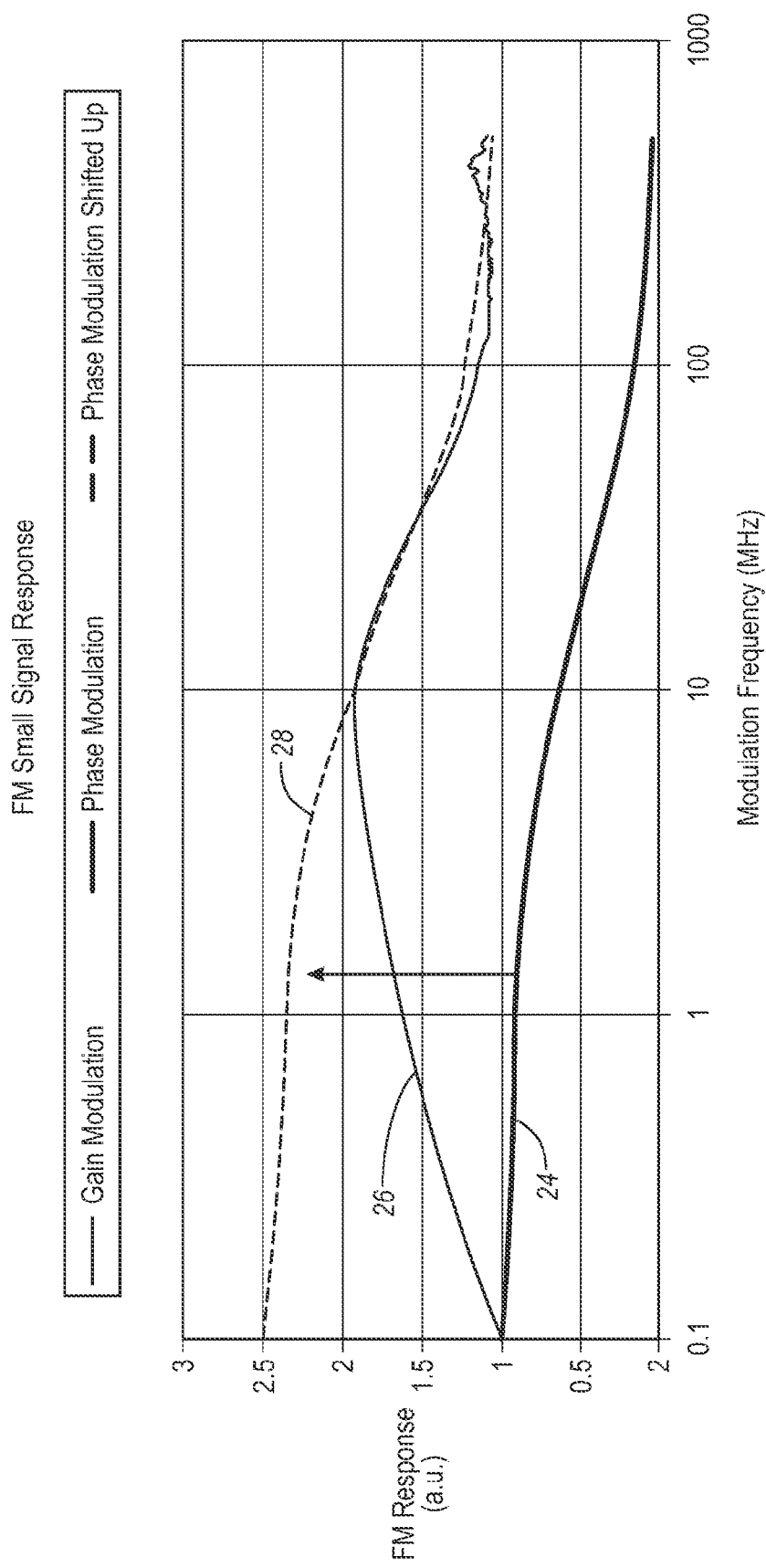
FIG. 4 is a plot comparing the frequency response of a prior-art DBR laser to both phase and gain modulation signals.

Slow chirp appears to be caused by electrical crosstalk between the modulated gain section and the DC current biased tuning section. A direct current modulation of the tuning section while keeping the gain section current constant shows the same feature as direct modulation of the gain section in frequency range of 10 to 100 MHz as illustrated in FIG. 4. When the tuning section of the DBR laser is modulated, the resulting frequency response of the laser is equivalent to the response when the gain section is modulated for the 10 to 100 MHz frequency range, as shown in FIG. 4, wherein line 24 represents the frequency response to phase modulation, line 26 represents the frequency response to gain modulation, and line 28 represents the frequency response to phase modulation shifted upward to illustrate the similarity between the frequency responses to gain and phase modulation in the 10 to 100 MHz frequency range. When the crosstalk between modulated gain section and tuning section is considered, the FM small signal response of Equation 1 can be modified according to equations 4 and 5:

$$\frac{\Delta v}{\Delta I_g} = \left(\frac{\Delta v}{\Delta I_g}\right)_{Carrier} + \left(\frac{\Delta v}{\Delta I_g}\right)_{thermal} + \left(\frac{\Delta v}{\Delta I_t}\right)_{tuning}\left(\frac{\Delta I_t}{\Delta I_g}\right) \quad \text{(Eq. 4)}$$

$$\left(\frac{\Delta v}{\Delta I_t}\right)_{tuning} = \frac{v_{tuning}}{1 + j\omega\tau_{carrier}} \quad \text{(Eq. 5)}$$

in which $\Delta I_t/\Delta I_g$ defines the X-talk between modulation gain section and tuning section, $v_{tuning}$ is the wavelength tuning efficiency of tuning section (typically ~100 GHz/mA), $\tau_{carrier}$ is the carrier lifetime of the tuning section (typically ~5 ns).

Figure 5:
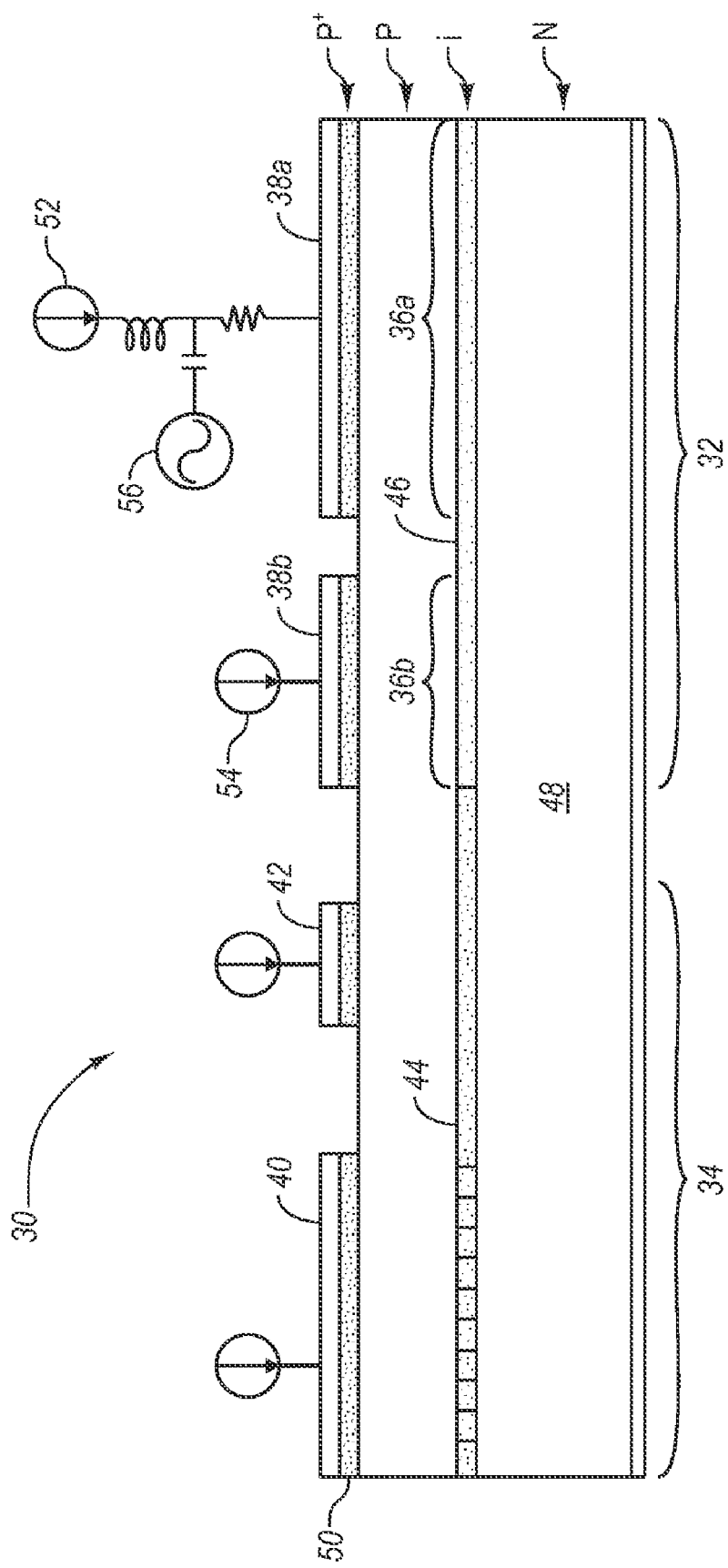
FIG. 5 is a side cross-sectional view of a DBR laser having a split gain contact in accordance with an embodiment of the present invention.

Systems and methods according to some embodiments of the present invention provide means for reducing slow chirp induced by the electrical X-talk between the gain modulation section and DC current biased phase section and DBR section Referring to FIG. 5, a DBR laser 30 includes a gain section 32 and a tuning section 34. The gain section 32 includes two sections 36a, 36b each including a corresponding contact 38a and 38b for current injection. Positioned over the tuning section 34 are electrodes for tuning the frequency of the laser, such as a DBR bias contact 40 and a phase bias contact 42. The gain section 32 and tuning section 34 are embodied as waveguides 44, 46 embedded within a semiconductor substrate 48, such as InP. In the illustrated embodiment, the waveguides 44, 46 are formed of i-type semiconductor material positioned between P- and N-type material. The contacts 38a, 38b, 40 and 42 may be formed of metal formed on a layer 50 of heavy P (P+) material, such as InGaAs, formed on the semiconductor substrate 48.

The electrical isolation between the two gain contacts 38a, 38b and the tuning contacts 40, 42 may be obtained by etching away the P+ layer 50 between adjacent contacts. In some embodiments, the isolation resistance between the two gain contacts 38a, 38b and one or both of the DBR bias contact 40 and phase bias contact 42 is substantially greater than the serial resistance experienced by current passing through only one of the gain sections 36a, 36b or the tuning section 34. For example, the isolation resistance may be greater than 200 times the serial resistance, preferably greater than 400 times. The isolation resistance between the gain contacts 38a, 38b and adjacent contacts is preferably greater than 1 kOhm, more preferably greater than 2 kOhm.

The gain contacts 38a, 38b may be biased separately with DC current sources 52, 54. A modulation current source 56 is coupled to the first gain contact 38a for injecting a modulating current. The first gain contact 38a is distanced from the tuning section 34, with the second gain contact 38b positioned between itself and the tuning section 34. The second gain contact 38b, which is located between the first contact 38a and the tuning section 34, is biased with DC current source 54. The second gain contact 38b, DBR bias contact 40, and phase bias contact 42 are preferably modulated by substantially DC voltages that have a frequency substantially less than the modulation frequency of the modulation current source 56, preferably less than 5% of the carrier frequency, frequency excursion, peak frequency, or bit rate of the signal supplied by the modulation current source 56.

The gain section 36b adjacent the tuning section 34 may be either a single mode waveguide, or multimode waveguide if applicable.

Figure 6:
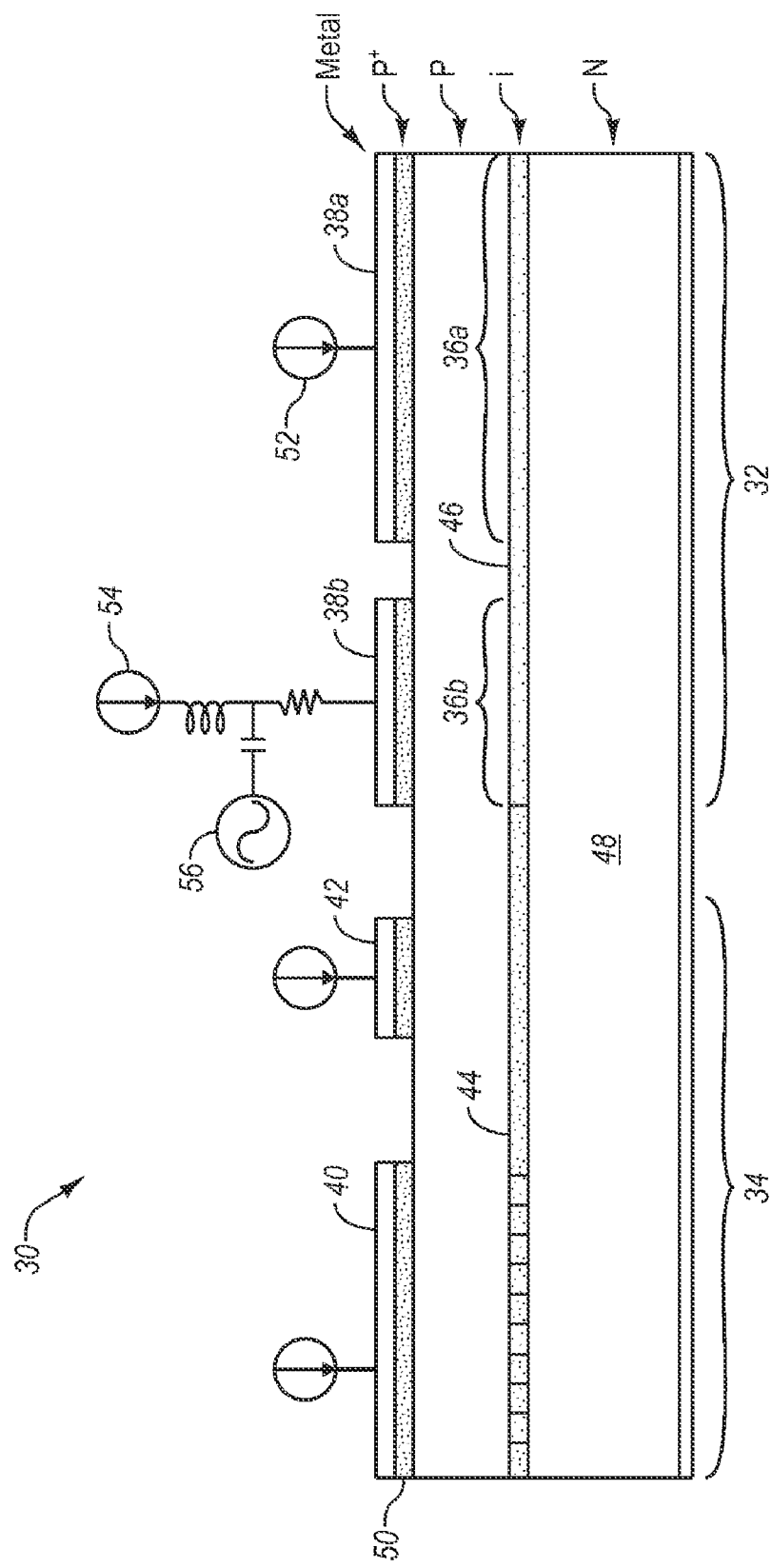
FIG. 6 is a side cross-sectional view of a DBR laser having a split gain contact in accordance with an embodiment of the invention and having modulating current injected adjacent a tuning section.

To demonstrate the suppression of slow chirp using the proposed scheme, two experiments were performed with the split gain contact laser proposed above. In a first experiment, the second gain contact 38b adjacent the tuning section 34 is modulated while the first gain contact 38a distanced from the tuning section 34 is biased with a DC current source, as shown in FIG. 6. In a second experiment, the second gain section contact 38b close to the tuning section 34 is biased with a DC current source while the first gain section 38a away from the tuning section 34 is modulated, according to the diagram of FIG. 5. In the experimental setup, the length of the second gain contact 38b close to the tuning section was 180 μm, and it was biased at 50 mA. The length of the first gain section 36a distanced from the tuning section 34 was 300 μm and it was biased at 80 mA. The separation resistances between adjacent contacts was measured to be ~2 kOhm, and the serial resistance of the gain section 32 and tuning section 34 when forward biased was ~5 Ohm.

Figure 7:
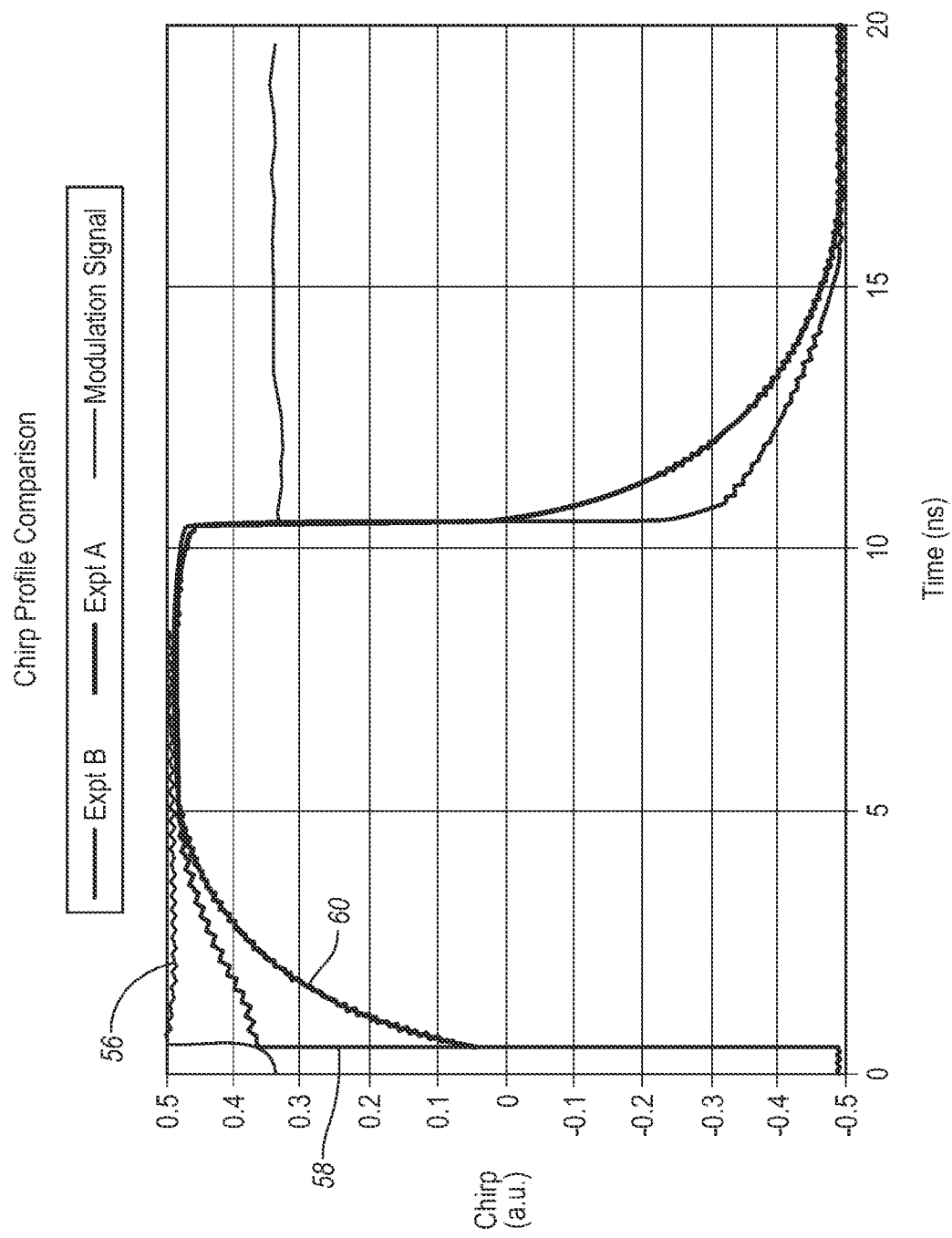
FIG. 7 is a plot illustrating the improved chirp profile of a split contact laser in accordance with an embodiment of the present invention as compared to a prior-art DBR laser.

FIG. 7 illustrates the time domain chirp profile of the DBR lasers 30 of FIGS. 5 and 6. In FIG. 7, line 56 represents an input voltage, lines 58 and 60 represent the time domain chirp profile of the lasers of FIGS. 5 and 6, respectively. It is apparent from FIG. 7 that the ratio between slow chirp and adiabatic chirp is ~1:1 when the second gain contact 38b close to the tuning section 34 is modulated, whereas the ratio between slow chirp and adiabatic chirp is ~1:5 when the second gain contact 38b close to the tuning section 34 is biased with a DC current source and the first gain contact 38a away from the tuning section 34 is modulated. A laser modulated according to the novel system and method disclosed herein is therefore effective to reduce the effect of slow chirp on the frequency response of a DBR laser 30.

Figure 1:
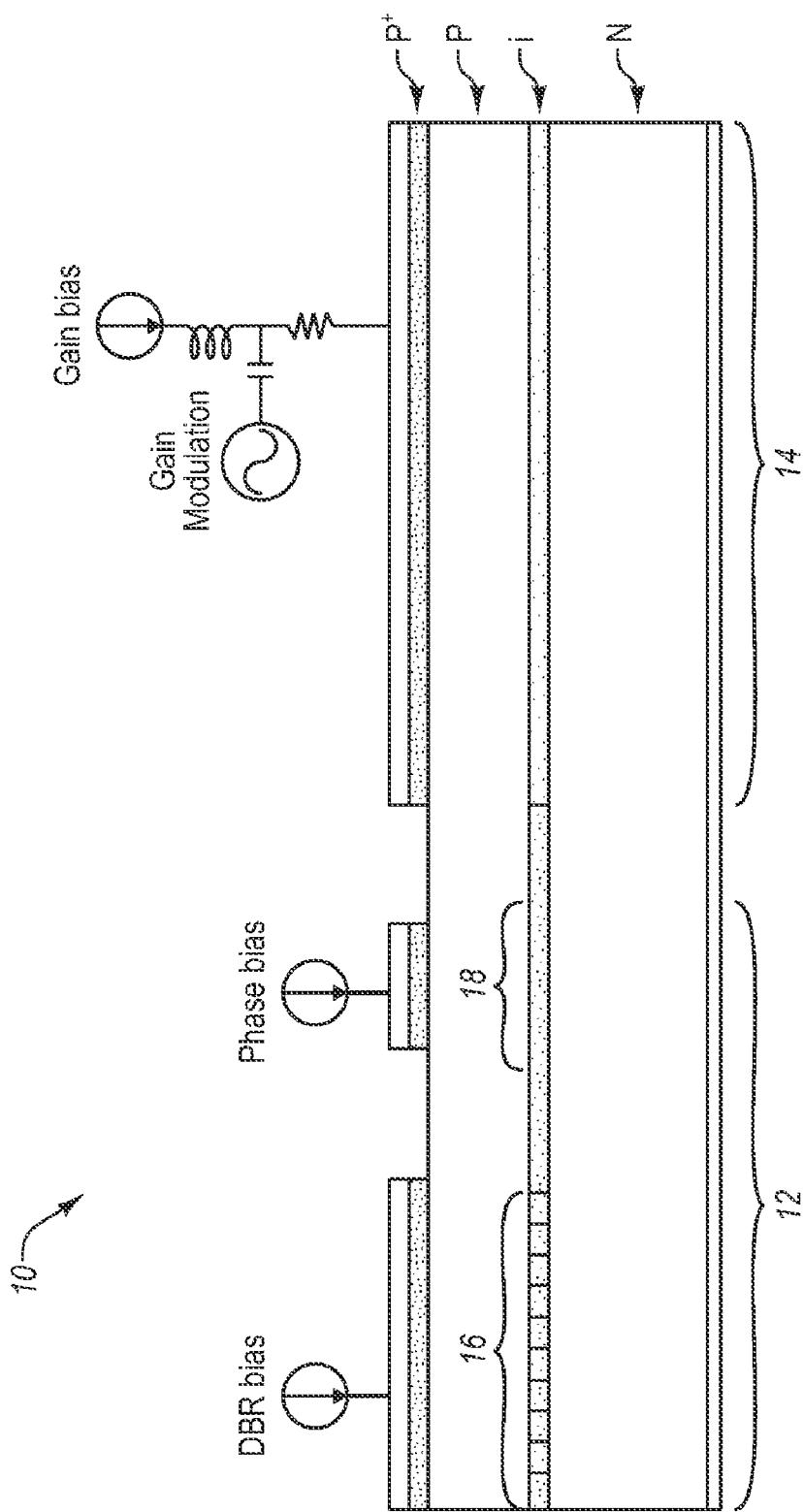
FIG. 1 is a side cross-sectional view of a DBR laser in accordance with the prior art.
Figure 2:
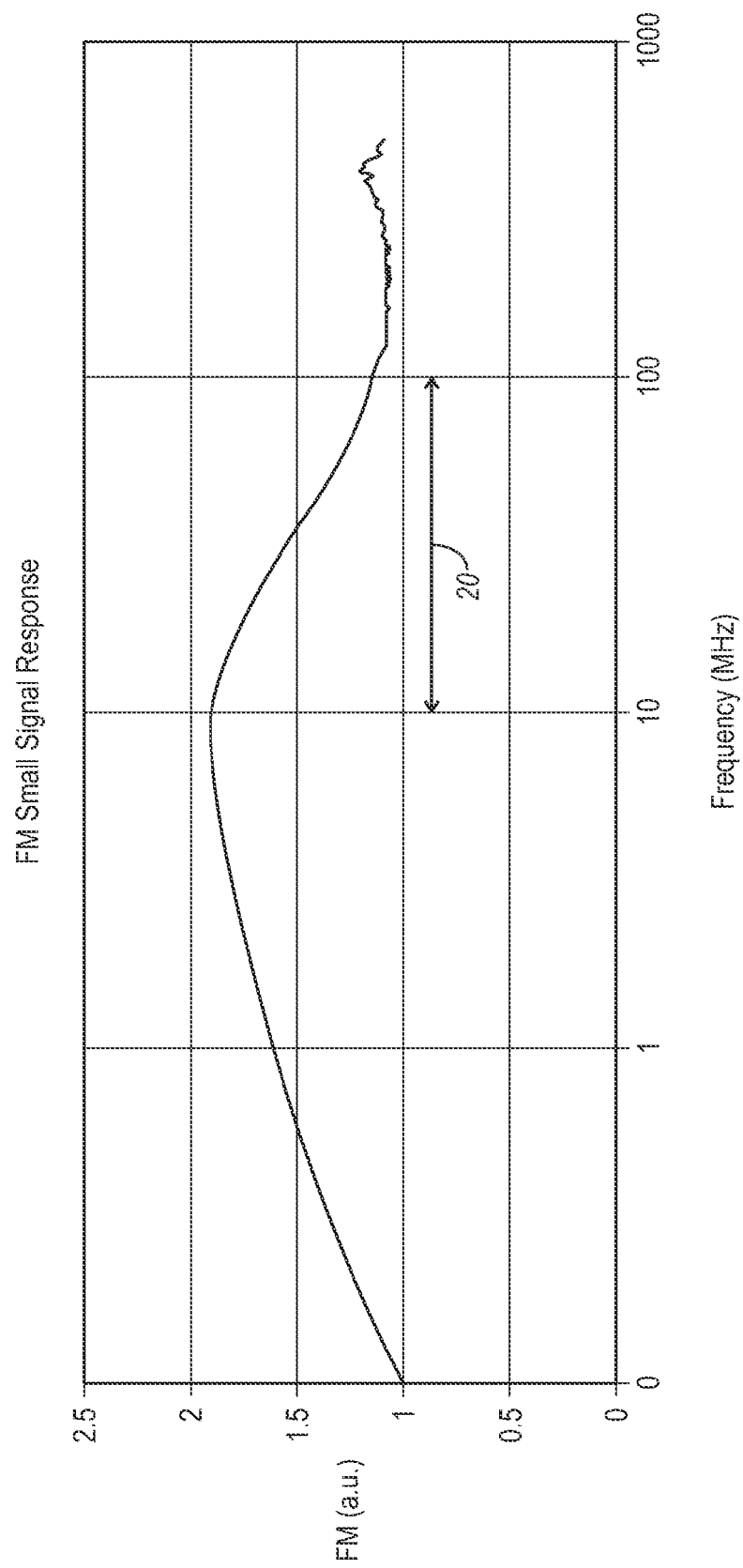
FIG. 2 is a plot of the small frequency modulation response of a DBR laser in accordance with the prior art.
Figure 3:
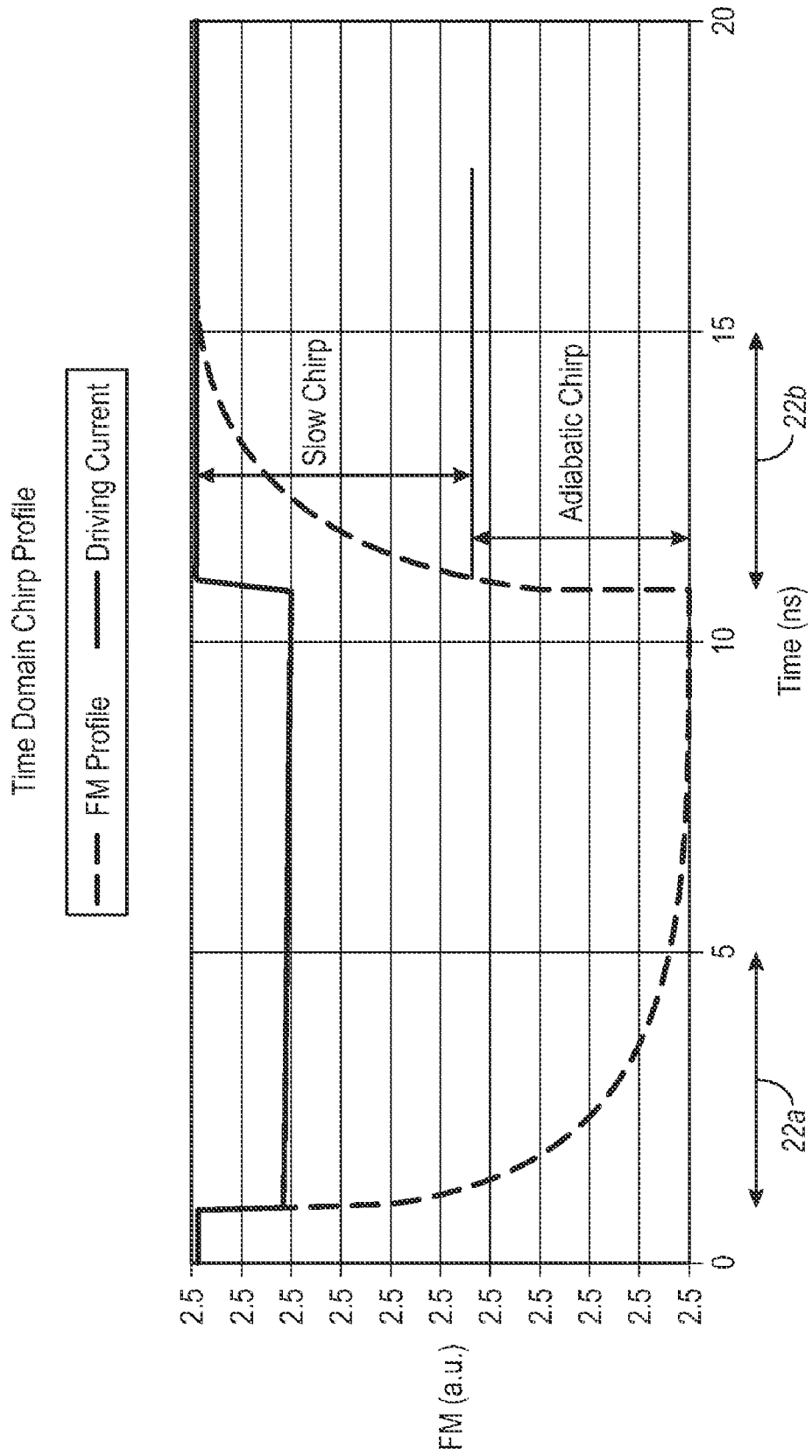
FIG. 3 is a plot of the chirp profile of a DBR laser in accordance with the prior art.

To explain the reduction of the slow chirp, the equivalent electrical circuits of the schemes in FIGS. 1 and 5 are compared below. The equivalent electrical circuit of the laser of FIG. 1 is shown in FIG. 8A. The equivalent electrical circuit for the laser of FIG. 5 is shown in FIG. 8B. The components of the circuit of FIG. 8A, including exemplary resistance and capacitance values, are as follows:

$R_M$ is the impedance matching resistance of a driving circuit (45 Ohm);
$C_{pg}$ is the parasitic capacitance in the gain section (4 pF);
$R_{sg}$ is the serial resistance in the gain section (5 Ohm);
$R_{isolation}$, is the isolation resistance between gain and tuning section (2 kOhm);
$C_{pt}$ is the parasitic resistance in the tuning section (4 pF);
$R_{st}$ is the serial resistance in the tuning section (5 Ohm);
$i_g$ is the modulated current in the gain section; and
$i_t$ is the modulated current in the tuning section.

The components of the circuit of FIG. 8B are as follows:
$R_M$ is the impedance matching resistance (45 Ohm);
$C_{pg1}$ is the parasitic resistance in the first gain section 36a (4 pF);
$R_{sg1}$ is the serial resistance in the first gain section 36a (5 Ohm);
$R_{isolation1}$ is the isolation resistance between first gain section 36a and the second gain section 36b;
$C_{pg2}$ is the parasitic capacitance in the second gain section 36b (4 pF);
$R_{sg2}$ is the serial resistance in the second gain section 36b (5 Ohm);
$R_{isolation2}$ is the isolation resistance between the second gain section 36b and the tuning section 34 (2 kOhm);

$C_{pt}$ is the parasitic capacitance in the tuning section 34 (4 pF);
$R_{st}$ is the serial resistance in tuning section 34 (5 Ohm);
$i_{g1}$ is the modulated current coupled to the first gain contact 38a;
$i_{g2}$ is the DC current coupled to the second gain contact 38b; and
$i_t$ is the modulated current injected into the tuning section 34.

For the equivalent circuit in FIG. 8A in the modulation frequency range of 10 to 100 MHz, the ratio between slow chirp and adiabatic chirp, which is proportional to $i_t/i_g$ can be expressed by Equation 6:

$$\frac{\Delta v_{slow}}{\Delta v_{adiabatic}} = \frac{i_t}{i_g} \frac{v_{tuning}}{v_{adiabatic}} \quad \text{(Eq. 6)}$$
$$= \frac{R_{sg}}{R_{isolation}} \frac{v_{tuning}}{v_{adiabatic}}$$

For the equivalent circuit of FIG. 8B in the modulation frequency range of 10 to 100 MHz, and where $R_{sg2}=R_{st}=R_{sg}$, $C_{pg2}=C_{pt}=4$ pF, $R_{isolation1}=R_{isolation2}=R_{isolation}$, and $\omega C_{pg} \ll 1/R_{sg}$, the ratio between slow chirp and adiabatic chirp, which is proportional to $i_t/i_{g1}$ may be expressed by Equation 6. In some embodiments $C_{pg}$ is substantially greater than $1/(\omega R_{st})$ where ω lies within the frequency modulation bandwidth of the modulation signal applied to the first gain electrode 38a. The frequency modulation bandwidth of the modulation signal may be defined as the frequency band containing 98% of the energy of the frequency modulated signal. The electrical X-talk between the modulated gain section and DC biased gain section typically does not produce slow chirp because the carrier density in the DC biased gain section is clamped due to stimulated emission.

$$\frac{\Delta v_{slow}}{\Delta v_{adiabatic}} = \frac{i_t}{i_{g1}} \frac{v_{tuning}}{v_{adiabatic}} \quad \text{(Eq. 7)}$$
$$= \left(\frac{R_{sg}}{R_{isolation}}\right)^2 \frac{v_{tuning}}{v_{adiabatic}}$$

A comparison of Equations 6 and 7 shows that the slow chirp using the split contacts 38a, 38b on the gain section 32 will be reduced relative to the slow chirp without the split contacts 38a, 38b by a factor of $R_{sg}/R_{isolation}$ (~1/400).

The experimentally observed reduction of slow chirp is ~5 times less than without the split contacts 38a, 38b, which does not match exactly the results of Equations 6 and 7. The difference between experimental and actual results may be caused by absorption of the tuning section 34. When the gain section 32 is modulated, the laser power will also be modulated. Absorption current in the tuning section 34 will therefore result in modulation of the carrier density of the tuning section 34, which introduces some slow chirp.

Referring to FIG. 9, crosstalk between the gain section 32 and tuning section 34 may be further reduced by using capacitances coupled to both the DC biased gain electrode 38b and one or both of the DBR bias electrode 40 and phase electrode in the tuning section 34. The equivalent circuit of the proposed scheme is shown in FIG. 9, which illustrates a scheme of capacitors $C_{P1}$, $C_{P2}$ coupled to both the second gain contact 38 and the DBR bias contact 40. The capacitors may have one terminal coupled to one of second gain contact 38 and DBR bias contact 40 and another terminal coupled to ground or some other reference voltage.

The components of the circuit of FIG. 9 are as follows:

$R_M$ is the impedance matching resistance (45 Ohm);

$C_{pg1}$ is the parasitic capacitance in the first gain section 36a (4 pF);

$R_{sg1}$ is the serial resistance in the first gain section 36a (5 Ohm);

$R_{isolation1}$ is the isolation resistance between first gain section 36a and the second gain section 36b;

$C_{pg2}$ is the parasitic capacitance in the second gain section 36b (4 pF);

$R_{sg2}$ is the serial resistance in the second gain section 36b (5 Ohm);

$R_{isolation2}$ is the isolation resistance between the second gain section 36b and the tuning section 36a (2 kOhm);

$C_{pt}$ is the parasitic capacitance in tuning section 34 (4 pF);

$R_{st}$ is the serial resistance in the tuning section 34 (5 Ohm);

$i_{g1}$ is the modulated current injected into the first gain section 36a;

$i_{g2}$ is the DC current injected into the second gain section 36b;

$i_t$ is the modulated current injected into the tuning section;

$C_{p1}$ is the capacitance wire bonded to the second gain section 36b; and $C_{p2}$ is the capacitance wire bonded to the tuning section 34.

For the modulation frequency range of 10 MHz to 100 MHz (above this range, the carrier in tuning section cannot respond, below this range, there is little effect to transmission performance of 10 Gb/s data rate), and $R_{sg2}=R_{st}=R_{sg}$, $C_{pg2}=C_{pt}=4$ pF $C_{p1}=C_{p2}=C_p$, and $R_{isolation1}=R_{isolation2}=R_{isolation}$, $\omega C_{pg} \ll 1/R_{sg}$, and $\omega C_p \gg 1/R_{sg}$ $$\frac{\Delta v_{slow}}{\Delta v_{adiabatic}} = \frac{i_t}{i_{g1}} \frac{v_{tuning}}{v_{adiabatic}} \quad \text{(Eq. 8)}$$
$$= \frac{1}{1+j\omega C_p R_{sg}} \left(\frac{R_{sg}}{R_{isolation}}\right)^2 \frac{v_{tuning}}{v_{adiabatic}}$$

From Equation 8, we can see that for 10 MHz, $R_{sg}=5$ Ohm, and $C_p \gg 3$ nF, the electrical isolation should be improved further.

Figure 10:
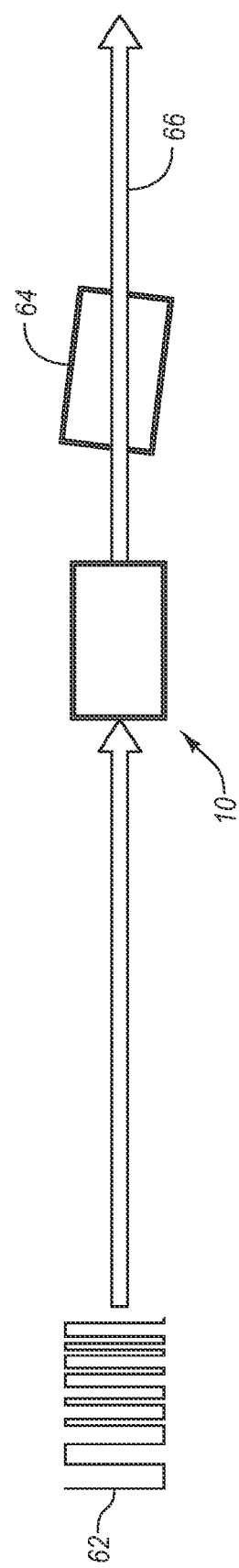
FIG. 10 is a schematic block diagram of a fiber optic communication system in accordance with an embodiment of the present invention.

Referring to FIG. 10, the DBR laser 10 may receive a binary data signal 62. The binary data signal may be coupled to the first gain electrode 38a. The DBR laser 10 transmits a frequency modulated signal encoding the binary data signal 62 through an optical spectrum reshaper 64. The output of the OSR 64 is coupled to coupling optics, such as a fiber pigtail, for coupling the transmitter to an optical fiber 66. The OSR 64 converts a frequency modulated signal from the DBR laser 10 to an amplitude modulated signal. However, the output of the OSR may also remain frequency modulated. The OSR may be embodied as one or more filters, including, but not limited to, a coupled multi-cavity (CMC) filter, a periodic multi-cavity etalon, a fiber Bragg grating, or any other optical element having a wavelength-dependent loss. The OSR 64 may also comprise a fiber, a Gire-Tournois interferometer, or some other element with chromatic dispersion.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A frequency modulated laser comprising:
    a modulated gain section, an un-modulated gain section, and a passive section;
    a driving circuit coupled to the modulated and un-modulated gain sections, the driving circuit configured to impose a substantially constant tuning bias on the un-modulated gain section, and a modulating current encoding a data signal on the modulated gain section in order to generate a frequency modulated signal with a substantially flat frequency response; and
    a tuning electrode and first and second gain electrodes; wherein the substrate is a semiconductor substrate having the tuning electrode positioned on the semiconductor substrate over the passive section, the first gain electrode positioned over the modulated gain section, and the second electrode positioned over the unmodulated gain section; and wherein the tuning electrode and first and second gain electrodes include metal and are bonded to a surface of the semiconductor substrate.

2. The laser of claim 1, further comprising a first capacitor having a first terminal coupled to the tuning electrode and a second terminal coupled to a reference voltage.

3. The laser of claim 2, further comprising a second capacitor having a first terminal coupled to the second gain electrode and a second terminal coupled to a reference voltage.

4. The laser of claim 3, wherein the first and second capacitor have capacitances substantially larger than $1/(\omega R_{st})$ where $R_{st}$ is a serial resistance of the passive section and $\omega$ lies within the frequency modulation bandwidth of the frequency modulated signal.

5. The laser of claim 1, wherein the passive section includes a distributed Bragg reflector.

6. A method for modulating a laser comprising:
    imposing a tuning voltage on a tuning electrode positioned over a reflector portion of a semiconductor laser cavity;
    imposing a bias voltage on a gain bias electrode positioned over a gain portion of the semiconductor laser cavity; and
    imposing a modulating voltage on a gain modulating electrode positioned over the gain portion to generate a frequency modulated signal encoding a data signal, the gain bias electrode positioned between the tuning electrode and the gain modulating electrode, the gain bias electrode electrically isolated from the tuning electrode and the gain modulating electrode by an isolation resistance;
    transmitting the frequency modulated signal through an optical spectrum reshaper operable to convert the frequency modulated signal into an at least partially amplitude modulated signal having amplitude modulation encoding the data signal.

7. The method of claim 6, wherein imposing the tuning voltage comprises imposing a substantially DC signal.

8. The method of claim 6, wherein imposing the bias voltage comprises imposing a substantially DC signal.

9. The method of claim 6, wherein the tuning voltage and the bias voltage have a frequency substantially less than the modulating voltage.

10. The method of claim 6, wherein imposing the modulating voltage on the gain electrode comprises imposing a bias signal and a data-encoding signal on the gain modulating electrode.

11. A fiber optic communication system comprising:
- a frequency modulated laser having a modulated gain section, an un-modulated gain section, and a passive section;
- an optical spectrum reshaper (OSR) adapted to receive a frequency modulated signal from the frequency modulated laser and reshape the frequency modulated signal into a frequency and amplitude modulated signal;
- a driving circuit coupled to the modulated and un-modulated gain sections, the driving circuit configured to impose a substantially constant tuning bias on un-modulated gain section, and a modulating current encoding a data signal on the modulated gain section in order to generate a frequency modulated signal; and
- a tuning electrode and first and second gain electrodes; wherein the substrate is a semiconductor substrate having the tuning electrode positioned on the semiconductor substrate over the passive section, the first gain electrode positioned over the modulated gain section, and the second electrode positioned over the unmodulated gain section; and wherein the tuning electrode and first and second gain electrodes include metal and are bonded to a surface of the semiconductor substrate.

12. The fiber optic communication system of claim 11, wherein the surface includes a layer of p+ semiconductor material.

13. The fiber optic communication system of claim 12, wherein the layer of p+ semiconductor material defines a first gap extending therethrough between the first and second gain electrodes.

14. The fiber optic communication system of claim 13, wherein the layer of p+ semiconductor material defines a second gap extending therethrough between the second gain electrode and the tuning electrode.

15. The fiber optic communication system of claim 11, wherein an isolation resistance between the second gain electrode and the tuning electrode is greater than about 1 kOhm.

16. The fiber optic communication system of claim 11, wherein the isolation resistance between the second gain electrode and the tuning electrode greater than about 2 kOhm.

17. The fiber optic communication system of claim 11, wherein an isolation resistance between the second gain electrode and the tuning electrode and between the first and second gain electrodes is greater than about 1 kOhm.

18. The fiber optic communication system of claim 17, wherein the isolation resistance between the second gain electrode and the tuning electrode and between the first and second gain electrodes is greater than about 2 kOhm.

19. The fiber optic communication system of claim 11, further comprising a first capacitor having a first terminal coupled to the tuning electrode and a second terminal coupled to a reference voltage.

20. The fiber optic communication system of claim 19, further comprising a second capacitor having a first terminal coupled to the second gain electrode and a second terminal coupled to a reference voltage.

21. The fiber optic communication system of claim 20, wherein the first and second capacitor have capacitances substantially larger than $1/(\omega R_{st})$ where $R_{st}$ is a serial resistance of the passive section and $\omega$ lies within the frequency modulation bandwidth of the frequency modulated signal.

22. The fiber optic communication system of claim 11, wherein the passive section includes a distributed Bragg reflector.

* * * * *